United States Patent
Chin

(10) Patent No.: US 6,849,485 B1
(45) Date of Patent: Feb. 1, 2005

(54) PROCESS SEQUENCE AND MASK LAYOUT TO REDUCE JUNCTION LEAKAGE FOR A DUAL GATE MOSFET DEVICE

(75) Inventor: Pin-Shyne Chin, Shinchu (TW)

(73) Assignee: Taiwan Semiconductor Manufacturing Company, Limited, Hsin-Chu (TW)

( * ) Notice: Subject to any disclaimer, the term of this patent is extended or adjusted under 35 U.S.C. 154(b) by 0 days.

(21) Appl. No.: 10/205,791

(22) Filed: Jul. 26, 2002

(51) Int. Cl.[7] .......................................... H01L 21/336
(52) U.S. Cl. ...................... 438/197; 438/216; 438/218; 438/283; 438/287; 438/294; 438/424; 438/585
(58) Field of Search ................................ 438/587–588, 438/591–594, 787–788, 981, 197, 216, 218–219, 221, 225, 229, 283, 287, 294–297, 299, 308, 424–425, 439, 585

(56) References Cited

U.S. PATENT DOCUMENTS

| | | | |
|---|---|---|---|
| 5,668,035 A | 9/1997 | Fang et al. | 438/239 |
| 5,741,740 A * | 4/1998 | Jang et al. | 438/424 |
| 6,074,915 A | 6/2000 | Chen et al. | 438/258 |
| 6,171,911 B1 | 1/2001 | Yu | 438/275 |
| 6,225,167 B1 | 5/2001 | Yu et al. | 438/275 |
| 2002/0105041 A1 * | 8/2002 | Goto et al. | 438/981 |

OTHER PUBLICATIONS

Wolf et al., "Silicon Processing For The VLSI Era", vol. 1, Lattice Press, 1986, pp. 198, 384–386, 532–534, 541–542, and 556–557.*

* cited by examiner

Primary Examiner—Lynne Gurley

(57) ABSTRACT

A method of forming a thin silicon dioxide gate insulator layer for use in dual gate insulator device has been developed, featuring a process sequence that results in a reduction of the recessing and notching of surrounding STI regions, and a reduction of silicon damage and device leakage, when compared to counterparts fabricated without the use of this invention. An insulator layer is grown on, and removed via a wet etch procedure, from only the portion of the active device region to be used to accommodate the thin silicon dioxide gate insulator component of the dual gate insulator device. The photolithographic layout and photoresist shape used for removal of these portions of the insulator layer, protect the surrounding STI regions from the wet etch procedure, in addition to leaving insulator layer on portions of the active device region, allowing the underlying portions of the active device region to be protected during a dry etch procedure used to define a conductive gate structure on the thin silicon dioxide gate insulator layer. The thin silicon dioxide gate insulator layer is grown on the portion of active device region previously occupied by the portion of insulator layer removed via the wet etch procedure.

26 Claims, 4 Drawing Sheets

PROCESS SEQUENCE AND MASK LAYOUT TO REDUCE JUNCTION LEAKAGE FOR A DUAL GATE MOSFET DEVICE

BACKGROUND OF THE INVENTION (1) Field of the Invention

The present invention relates to methods used to fabricate semiconductor devices, and more specifically to a method, and a design layout used, to optimize the yield of dual gate metal oxide semiconductor field effect transistor (MOSFET) devices.

(2) Description of Prior Art

Specific devices designed to provide dual voltage applications, particularly for the deep sub-micron technology, are achieved using two different gate insulator layer thicknesses, sometimes referred to as a dual gate oxide technology. However the process sequences used to form dual gate insulator layers can result in unwanted device leakage phenomena. For example a process used to form two different gate insulator layers entails removal of a first insulator layer, exposing first portions, or active device regions of a semiconductor substrate in which a thin gate insulator layer will be regrown on. Portions of unremoved first insulator layer located on second areas of the semiconductor substrate, now subjected to conditions used to grow the thin gate insulator layer will increase in thickness resulting in a second gate insulator layer located on second portions, or portions of the semiconductor substrate to be used for thicker gate insulator devices, with the second gate insulator layer greater in thickness than the thin gate insulator layer, again located on the thin gate insulator active device portions of the semiconductor substrate.

Although the process sequence described above can be used to obtain two gate insulator thicknesses, several vulnerable situations can be present. First, shallow trench isolation (STI) regions comprised of insulator filled shallow trench shapes is subjected to the process used to remove the first insulator layer. In addition to global recessing of the STI regions, local recessing or notching of the STI region, at the interface of the STI—active device region, can result in regions in which conductive materials used for gate and silicide regions, can be difficult to remove, resulting in gate to substrate leakage or shorts. In addition the dry etch definition of a gate structure, performed exposing the thin gate insulator in the active device region for the devices employing thin gate insulator layers, can result in silicon loss if the thin gate layer is removed during the gate definition procedure, again resulting in unwanted leakages as a result of substrate damage.

The present invention will describe a novel process sequence and mask layout in which the amount of STI area subjected to the process used to clear a subsequent active device region for thin gate insulator formation, is reduced. In addition this invention will describe a novel process sequence and mask layout, in which the amount of thin gate insulator area subjected to the gate structure definition procedure, is reduced. Prior art, such as: Yu et al, in U.S. Pat. No. 6,225,167 B1; Yu, in U.S. Pat. No. 6,171,911 B1; Fang et al, in U.S. Pat. No. 5,668,035; and Chen et al, in U.S. Pat. No. 6,074,915; all describe processes used to form dual gate insulator layers. However these prior arts do not describe the novel mask layout—process sequence combination disclosed in this present invention, in which STI recess and silicon damage is reduced during the process sequence used to fabricate dual gate insulator layers.

SUMMARY OF THE INVENTION

It is an object of this invention to fabricate a semiconductor device featuring two gate insulator thicknesses, a thin gate insulator layer for low voltage applications, and a thicker gate insulator layer for higher voltage applications.

It is another object of this invention to reduce STI recessing and notching occurring during insulator removal in the active device region used for the thin gate insulator, or low voltage application, via use of a novel photolithographic mask layout.

It is still another object of this invention to prevent silicon damage in the active device region of the thin gate insulator layer application, during definition of a gate structure, via use of a novel process sequence allowing the presence of thicker insulator layer to be used as an etch stop layer.

In accordance with the present invention a method of reducing silicon damage and reducing notching and recessing of insulator filled shallow trench regions, during the fabrication of a thin gate insulator gate layer, of dual gate insulator layer device, is described. A first insulator layer is grown on the portion of semiconductor substrate exposed in an active device region to be used for the thin gate insulator layer of the dual gate insulator device, with the active device region located between shallow trench isolation (STI) regions. Photolithographic procedures result in exposure of a first portion of the first gate insulator layer, while a second portion of the first gate insulator layer, and portions of the STI regions are not exposed. Removal of exposed portions of the first insulator layer via wet etch procedures result in an active device region now comprised of a first area of exposed semiconductor substrate and second areas of unetched first insulator layer located adjacent to the first area of exposed semiconductor substrate. Thermal growth of the thin gate insulator layer on the exposed first area of the active device region also results in additional insulator growth on portions of first insulator layer located in second areas of the active device region, resulting in a thicker second insulator layer. Deposition of, and patterning of a conductive layer, results in definition of a conductive gate structure overlying the thin gate insulator layer in the first area of the active device region. The thicker second insulator layer, located in the second areas of the active device region, exposed during the gate structure definition procedure, prevented damage to, and loss of, underlying semiconductor material. A thicker gate insulator layer, of the dual gate insulator layer, previously grown and located in a different active device region of the semiconductor substrate, is also overlaid with a conductive gate structure during gate structure definition procedure.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

Figure 1A:
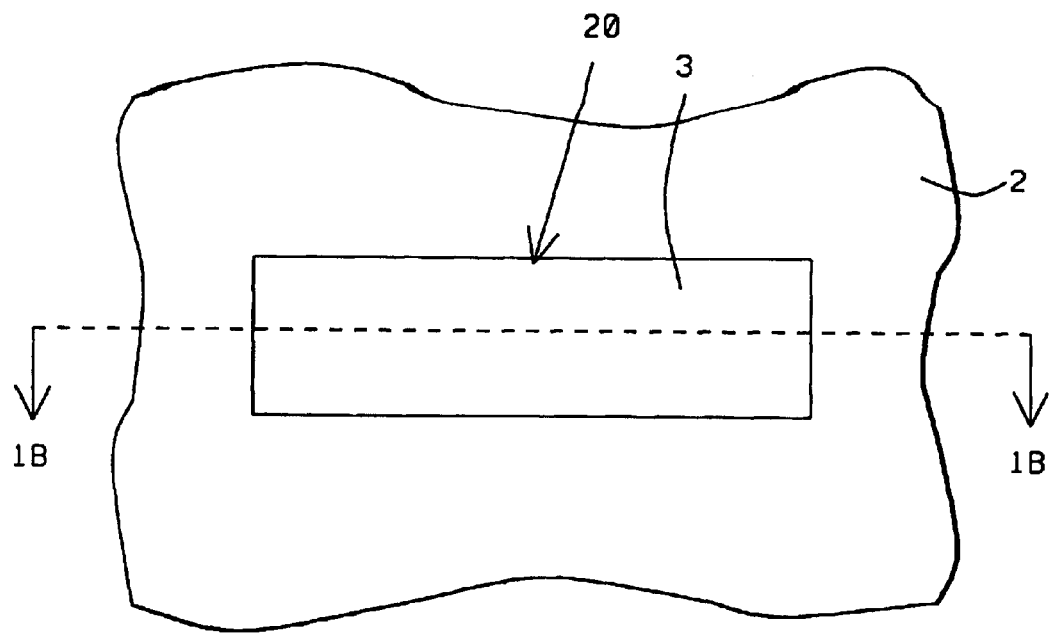
FIGS. 1A and 2A, which schematically show top views of the active device region used to accommodate the thin gate insulator layer, at various stages of the fabrication.
Figure 1B:
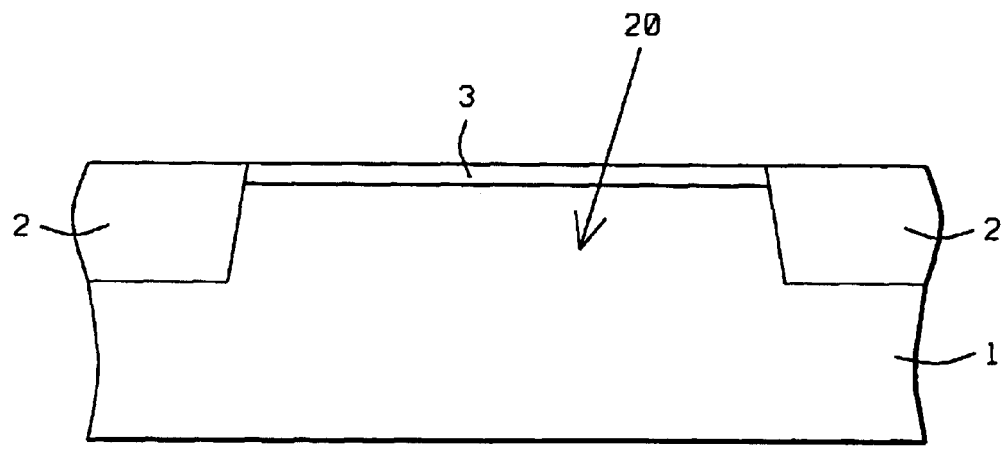
FIGS. 1B, 2B, and 3–6, which schematically, in cross-sectional style, show key stages of fabrication use to form the thin gate insulator layer of a dual gate insulator device.

The method of forming a thin gate insulator layer for a device comprised with dual gate insulator layers, featuring a reduction of silicon damage, and a reduction of STI recessing and notching, both occurring during the thin gate insulator fabrication sequence, will now be described in detail. Semiconductor substrate 1, comprised of single crystalline silicon, featuring a <100> crystallographic orientation, is used and schematically shown in FIG. 1B. Shallow trench isolation (STI) regions 2, are next formed in portions of semiconductor substrate 1. This is accomplished via definition of shallow trench shapes in semiconductor substrate 1, via photolithographic and dry etch procedure, to a depth between about 2000 to 6000 Angstroms, followed by filling of the shallow trench shapes with silicon oxide obtained via chemical vapor deposition procedures, using tetraethylorthosilicate (TEOS), as a source. Unwanted portions of the silicon oxide are removed via chemical mechanical polishing procedures resulting in the attainment of STI regions 2. Portions of semiconductor substrate 1, not occupied by STI regions 2, are used as active device regions 20, the regions of the dual gate insulator device used to accommodate the thin gate insulator component. First insulator layer 3, comprised of silicon dioxide, is next thermally grown on active device region 20, to a thickness between about 50 to 250 Angstroms, at a temperature between about 800 to 1000° C., in an oxygen—steam ambient. This is schematically shown in cross-sectional style in FIG. 1B, and schematically shown as a top view in FIG. 1A.

Figure 2A:
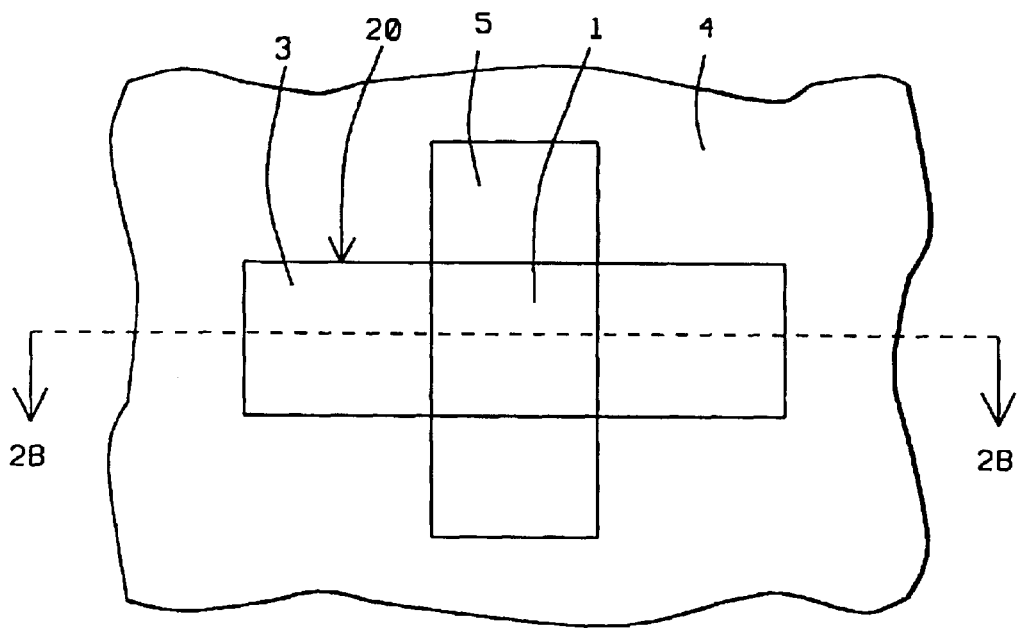
Figure 2B:
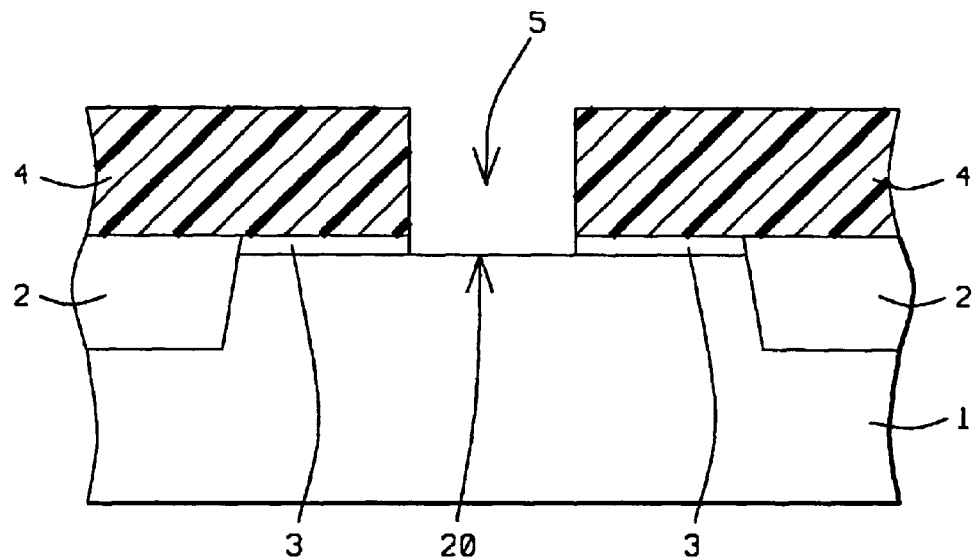

A photolithographic plate is next used to create photoresist shape 4, featuring opening 5, which exposes the portion of first insulator layer 3, located on a first area of active device region 20. This is shown schematically in top view 2A, and in cross-sectional style in FIG. 2B. The novel layout of the photolithographic plate minimized the exposure of STI regions 2, during the subsequent removal of the portions of first insulator layer 3, exposed in opening 5. First insulator layer 3, exposed in opening 5, of photoresist shape 4, is removed from a first area of active device region 20, via wet etch procedures using a buffered, or dilute hydrofluoric acid solution, exposing a portion of the surface of semiconductor substrate 1, in a first area of active device region 20. The novel feature of the photolithographic plate is the allowance of only a first area of active device region 20, to be cleared of first insulator layer 3, maintaining first insulator layer 3, in second areas of active device region 20. In addition the design layout of this photolithographic plate minimized the amount of STI area exposed to the HF procedure, thus minimizing notching at the active device region—STI interface, and limiting the amount of STI area subjected to recessing during the HF procedure.

Figure 3:
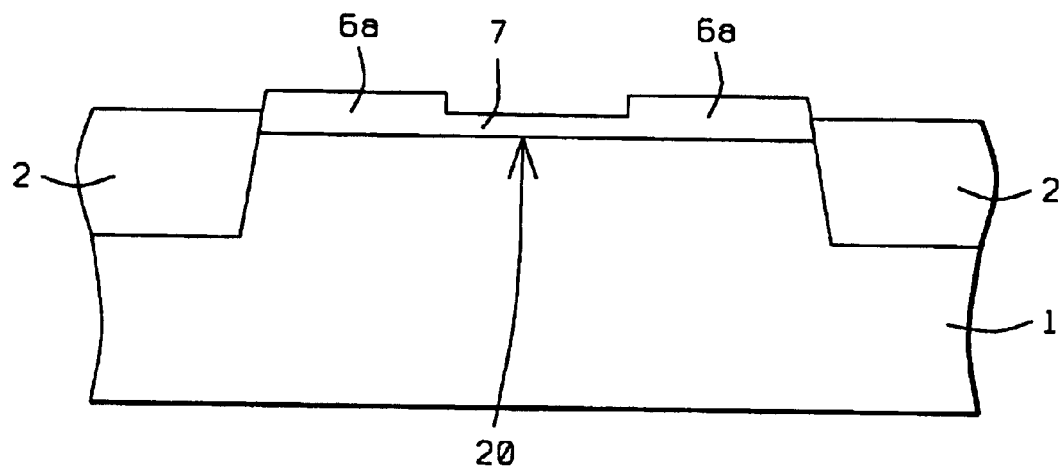

After removal of photoresist shape 4, via plasma oxygen ashing procedures, thin gate insulator layer 7, is formed on the portion of semiconductor substrate 1, exposed in the first area of active device region 20. Thin gate insulator layer 7, comprised of silicon dioxide, is thermally grown to a thickness between about 50 to 200 Angstroms, at a temperature between about 800 to 1100° C., in an oxygen—steam ambient. The same thermal oxidation procedures results in additional growth of first insulator layer 3, resulting in second insulator layer 6a, on second areas of active device region 20. Second insulator layer 6a, is comprised of silicon dioxide at a thickness between about 100 to 400 Angstroms. This is schematically shown in FIG. 3.

Figure 4:
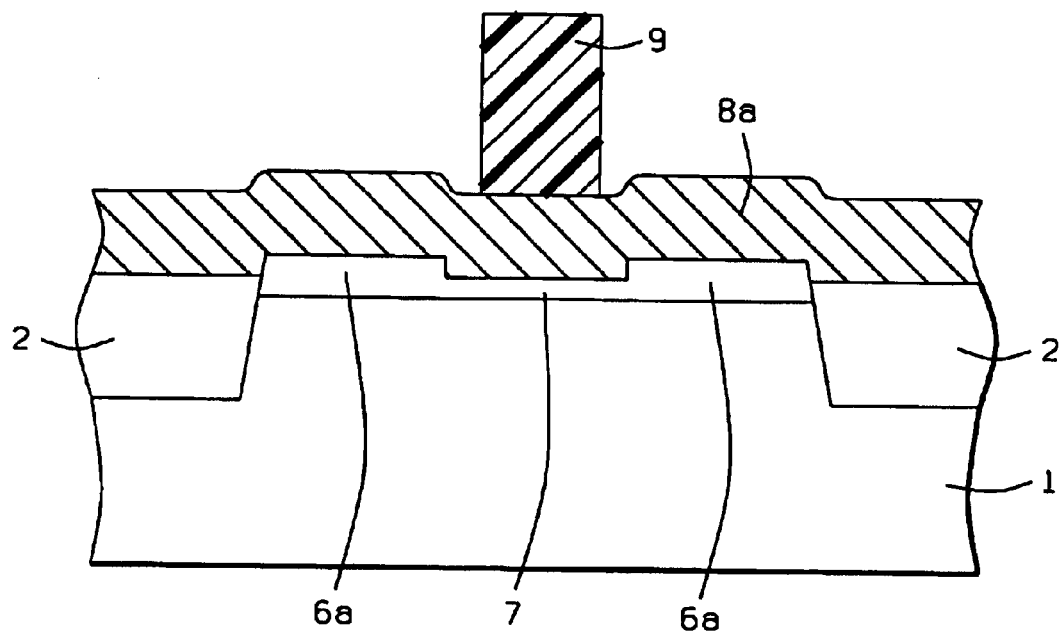

Conductive layer 8a, such as an in situ doped polysilicon layer, is next deposited via low pressure chemical vapor deposition (LPCVD), procedures, to a thickness between about 1000 to 2500 Angstroms. The polysilicon layer can also be deposited intrinsically rather than doped via implantation procedures. In addition if decreased word line resistance is desired conductive layer 8a, can be comprised of materials comprised of lower resistivity such as metal silicide or metal layers. Photoresist shape 9, is then formed on the portion of conductive layer 8a, which overlays only thin gate insulator layer 7, in the first area of active device region 20. This is schematically shown in FIG. 4.

Figure 5:
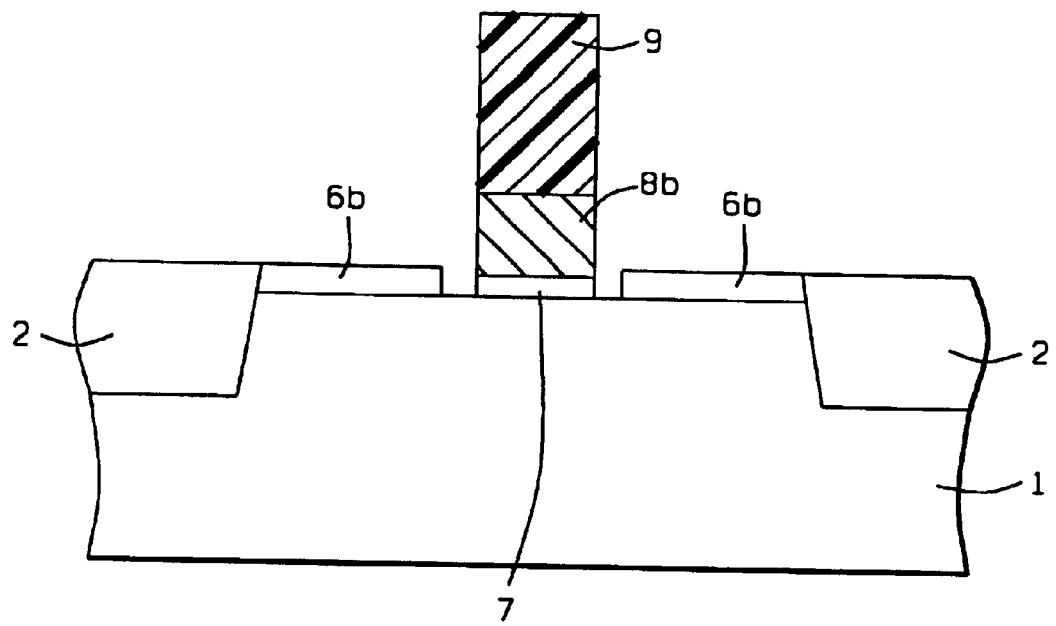

An anisotropic reactive ion etching (RIE), procedure is next employed to remove regions of conductive layer 8a, not covered by photoresist shape 9, resulting in conductive gate structure 8b, shown schematically in FIG. 5. The anisotropic RIE procedure is performed using $Cl_2$ or $SF_6$ as an etchant for conductive layer 8a, and although a high etch rate ratio of conductive layer 8a, to silicon dioxide, between about 10 to 1, to 20 to 1, does exist, at the conclusion of the conductive gate definition procedure portions of thin gate insulator layer 7, can be exposed and subjected to the REE procedure resulting in partial or complete removal of exposed portions of thin gate insulator layer located adjacent to conductive gate structure 8b. However it should be noted that the thicker, second insulator layer 6a, located in second areas of active device region 20, exposed at the conclusion of the conductive gate definition procedure, protected all of the second area of active device region 20, from possible silicon damage. This was made possible via the previous implementation of the novel photolithographic plate design which allowed first insulator layer 3, to be protected from the wet etch removal procedure used to clear first insulator layer 3, from only a first area of active device region 20. Second insulator layer 6a, subjected to the gate structure definition procedure is now reduced to insulator layer 6b, at a thickness between about 150 to 300 Angstroms. Thus the use of the novel photolithographic plate design, in addition to the above described process sequence, allowed reduced areas of STI notching and recessing, as well as reduced areas of possible silicon damage of active device region 20, reducing the risk of junction leakage.

Figure 6:
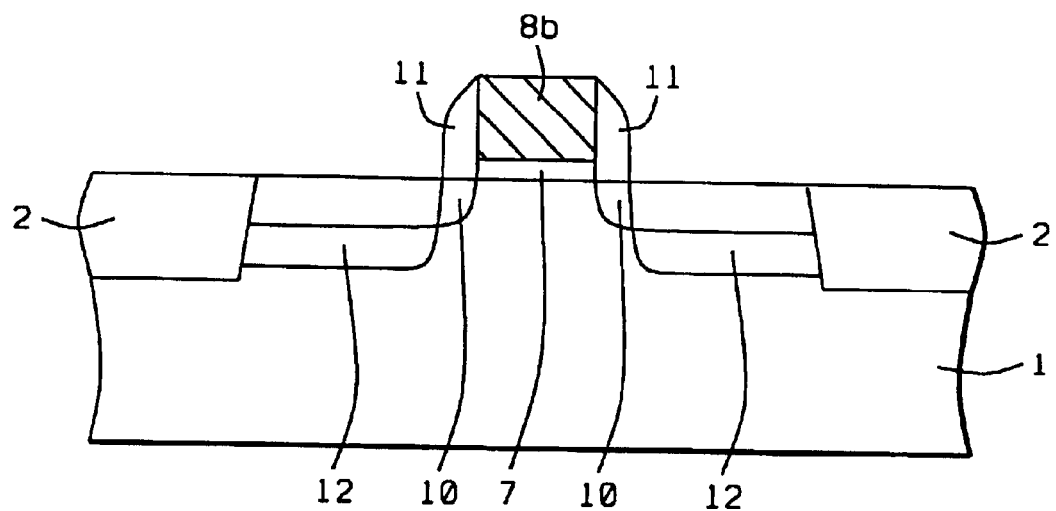

The conclusion of the process sequence, and novel photolithographic plate design layout, employed in the fabrication of the thin gate insulator layer of a dual gate insulator device, is next described. The thick gate insulator layer of the dual gate insulator layer, at this stage of processing may have been formed in other active device regions, prior to the formation of the thin gate insulator layer described in the previous sections of this invention, or second insulator layer 6b, can be used as the thick gate insulator layer. In either case conductive gate structure 8b was defined overlying each gate insulator layer. The conclusion of this process sequence however will be applied to, and described for the thin gate insulator layer component of the dual gate insulator device. After removal of photoresist shape 9, via plasma oxygen ashing procedures, lightly doped source/drain region 10, is formed via implantation of ions into portions of semiconductor substrate 1, or into portions of active device region 20, not covered by conductive gate structure 8a. If the dual gate device is to be an N channel device, lightly doped source/drain region 10, is formed in a P well region, (not shown in the drawings), in semiconductor substrate 1, via implantation of arsenic or phosphorous ions, at an energy between about 10 to 70 KeV, at a dose between about 1E13 to 1E14 atoms/$cm^2$. If the dual gate device is to be a P channel device, lightly doped source/drain region 10, is formed in an N well region, (not shown in the drawings), in semiconductor substrate 1, via implantation of boron or $BF_2$ ions, at an energy between about 10 to 70 KeV, at a dose between about 1E13 to 1E14 atoms/$cm^2$. Insulator spacers 11, comprised of silicon oxide or silicon nitride, are next formed on the sides of conductive gate structure 8a. This is accomplished via deposition of silicon oxide or silicon nitride at a thickness between about 1000 to 3000 Angstroms, via LPCVD or via plasma enhanced chemical vapor deposition (PECVD) procedures, followed by a blanket, selective, anisotropric RIE procedure using $CHF_3$ or $CF_4$ as an etchant. The anisotropic RIE procedure also results in removal of second insulator 6b, from the top surface of the second areas of active device region 20. Heavily doped source/drain region 12, is next formed via ion implantation of ions into portions of the active device region not covered by conductive gate structure 8b, or by insulator spacers 11. Again if the dual gate device is to be an N channel device, heavily doped source/drain region 12, is formed in a P well region located in semiconductor substrate 1, via implantation of arsenic or phosphorous ions, at an energy between about 20 to 100 KeV, at a dose between about 5E14 to 1E16 atoms/cm$^2$. If the dual gate device is to be a P channel device, heavily doped source/drain region 12, is formed in an N well region in semiconductor substrate 1, via implantation of boron or $BF_2$ ions, at an energy between about 20 to 100 KeV, at a dose between about 5E 14 to 1E16 atoms/cm$^2$. The result of these procedures is schematically shown in FIG. 6. The portion of the dual gate insulator device comprised with the thick gate insulator layer, is subjected to the same source/drain, insulator spacer formation procedures just described and used for the thin gate insulator layer component.

While this invention has been particularly shown and described with reference to, the preferred embodiments thereof, it will be understood by those skilled in the art that various changes in form and details may be made without departing from the spirit and scope of this invention.

What is claimed is:

1. A method of forming a thin gate insulator layer for a dual gate insulator, metal oxide semiconductor field effect transistor (MOSFET) device, on a semiconductor substrate, comprising the steps of:

providing a portion of said semiconductor substrate surrounded by insulator filled, shallow trench isolation (STI) regions, to be used as an active device region;

forming a first insulator layer on a first area of said active device region, leaving a second area of said active device region bare;

performing a procedure to form a thin gate insulator layer on said second area of said active device region, with said procedure converting said first insulator layer located on said first area of said active device region to a thicker second insulator layer; and performing a definition procedure to form a conductive gate structure overlying a first portion of said thin gate insulator layer while a second portion of said thin gate insulator layer not covered by said conductive gate structure is removed and with said second insulator layer protecting said first area of said active device region thinned during said definition procedure.

2. The method of claim 1, wherein said STI regions are shallow trench shapes formed to a depth between about 2000 to 6000 Angstroms, in said semiconductor substrate.

3. The method of claim 1, wherein said STI regions are filled with silicon oxide, obtained via chemical vapor deposition procedures, using tetraethylorthosilicate (TEOS) as a source.

4. The method of claim 1, wherein said first insulator layer is a silicon oxide layer, at a thickness between about 50 to 250 Angstroms, obtained via thermal oxidation procedures performed at a temperature between about 800 to 1100° C., in an oxygen—steam ambient.

5. The method of claim 1, wherein said first insulator layer is removed in said second area of said active device region via a wet etch procedure using a buffered hydrofluoric (BHF), or a dilute hydrofluoric (DHF) solution.

6. The method of claim 1, wherein said procedure used to form said thin gate insulator layer on said second area of said active device region, and to convert said first insulator layer to said second insulator layer, located on said first area of said active device region, is a thermal oxidation procedure, performed at a temperature between about 800 to 1100° C., in an oxygen—steam ambient.

7. The method of claim 1, wherein said thin gate insulator layer is a silicon dioxide layer, at a thickness between about 50 to 200 Angstroms.

8. The method of claim 1, wherein said second insulator layer is a silicon dioxide layer, at a thickness between about 100 to 400 Angstroms.

9. The method of claim 1, wherein said conductive gate structure is comprised of dope polysilicon, at a thickness between about 1000 to 2500 Angstroms.

10. The method of claim 1, wherein said conductive gate structure is comprise of a metal or metal silicide.

11. The method of claim 1, wherein said definition procedure used to form said conducive gate structure, is an anisotropic RIE procedure, using $Cl_2$ or $SF_6$ as an etchant for a conductive layer.

12. The method of claim 1, wherein the etch rate ratio of a conductive layer to said definition procedure, is between about 10 to 1, to 20 to 1.

13. A method of forming a thin silicon dioxide gate insulator layer as a component of a dual gate insulator MOSFET device, on a semiconductor substrate, comprising the steps of:

forming insulator filled STI regions in a first portion of said semiconductor substrate, while a remaining bare, second portion of said semiconductor substrate, not occupied by said STI regions is used for an active device region;

performing a first thermal oxidation procedure to grow a first silicon dioxide layer on said active device region;

performing a wet etch procedure to remove a first region of said first silicon dioxide layer from a first area of said active device region, while a second region of said first silicon dioxide layer located overlying a second area of said active device region, and while portions of said STI regions, are protected during said wet etch procedure;

performing a second thermal oxidation procedure to form said thin silicon dioxide gate insulator layer on said first area of said active device region, with said second thermal oxidation procedure changing said first silicon dioxide layer to a thicker, second silicon dioxide layer;

depositing a conductive layer; and performing a selective dry etch procedure to form a conductive gate structure on an underlying first portion of said thin silicon dioxide gate insulator layer, while second portions of said thin silicon dioxide gate insulator layer not covered by said conductive gate structure are removed, and with portions of said second silicon dioxide layer located in said active device region, and not covered by said conductive gate, thinned during said selective dry etch procedure, with said thinned portions of said second silicon dioxide layer remaining to protect an underlying portion of said active device region during said selective dry etch procedure.

14. The method of claim 13, wherein said STI regions are shallow trench shapes formed to a depth between about 2000 to 6000 Angstroms, in said semiconductor substrate.

15. The method of claim 13, wherein STI regions are filled with silicon oxide, obtained via chemical vapor deposition procedures, using tetraethylorthosilicate (TEOS) as a source.

16. The method of claim 13, wherein said first thermal oxidation procedure used to grow said first silicon dioxide layer, is performed at a temperature between about 800 to 1100° C., in an oxygen—steam ambient.

17. The method of claim 13, wherein the thickness of said first silicon dioxide layer is between about 50 to 250 Angstroms.

18. The method of claim 13, wherein said second region of said first silicon dioxide layer, located in said second area of said active device region, and portions of said STI regions, are protected by a photoresist shape during said wet etch procedure.

19. The method of claim 13, wherein said wet etch procedure used to remove said first region of said first silicon dioxide layer in said first area of said active device region, is performed using a buffered hydrofluoric (BHF), or a dilute hydrofluoric (DHF) solution.

20. The method of claim 13, wherein said second thermal oxidation procedure used to grow said thin silicon dioxide gate insulator layer, is performed at a temperature between about 800 to 1100 ° C., in an oxygen—steam ambient.

21. The method of claim 13, wherein the thickness of said thin silicon dioxide gate insulator layer located on said first area of said active device region, is between about 50 to 200 Angstroms.

22. The method of claim 13, wherein the thickness of said second silicon dioxide layer is between about 100 to 400 Angstroms.

23. The method of claim 13, wherein said conductive layer is an in situ doped polysilicon layer, obtained at a thickness between about 1000 to 2500 Angstroms, via LPCVD procedures.

24. The method of claim 13, wherein said conductive layer is a metal layer, or a metal silicide layer, obtained at a thickness between about 1000 to 2500 Angstroms.

25. The method of claim 13 wherein said selective dry etch procedure used to form said conductive gate structure, is an anisotropic RIE procedure, using $Cl_2$ or $SF_6$ as an etchant for a conductive layer.

26. The method of claim 13, wherein the etch rate ratio of a conductive layer to silicon dioxide, during said selective dry etch procedure, is between about 10 to 1, to 20 to 1.

* * * * *

UNITED STATES PATENT AND TRADEMARK OFFICE
CERTIFICATE OF CORRECTION

PATENT NO. : 6,849,485 B1
APPLICATION NO. : 10/205791
DATED : February 1, 2005
INVENTOR(S) : Pin-Shyne Chin Page 1 of 1

It is certified that error appears in the above-identified patent and that said Letters Patent is hereby corrected as shown below:

Column 3, line 24, delete "1000°" and insert therefor --1100°--.

Signed and Sealed this

Thirteenth Day of March, 2007

JON W. DUDAS
*Director of the United States Patent and Trademark Office*

UNITED STATES PATENT AND TRADEMARK OFFICE
CERTIFICATE OF CORRECTION

PATENT NO. : 6,849,485 B1 Page 1 of 1
APPLICATION NO. : 10/205791
DATED : February 1, 2005
INVENTOR(S) : Pin-Shyne Chin It is certified that error appears in the above-identified patent and that said Letters Patent is hereby corrected as shown below:

Column 3, line 24, delete "1000°" and insert therefor --1100°--.

Signed and Sealed this

Twenty-seventh Day of March, 2007

JON W. DUDAS
*Director of the United States Patent and Trademark Office*